US012702054B2

(12) United States Patent
Nakamata

(10) Patent No.: US 12,702,054 B2
(45) Date of Patent: Aug. 4, 2026

(54) SEMICONDUCTOR DEVICE

(71) Applicant: FUJI ELECTRIC CO., LTD., Kawasaki (JP)

(72) Inventor: Yuko Nakamata, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 626 days.

(21) Appl. No.: 17/824,403

(22) Filed: May 25, 2022

(65) Prior Publication Data

US 2023/0058727 A1 Feb. 23, 2023

(30) Foreign Application Priority Data

Jul. 16, 2021 (JP) ................................ 2021-118288

(51) Int. Cl.

| | |
|---|---|
| ***H10W 74/47*** | (2026.01) |
| ***H10W 40/25*** | (2026.01) |
| ***H10W 74/10*** | (2026.01) |
| ***H10W 76/136*** | (2026.01) |

(52) U.S. Cl.

CPC ....... *H10W 74/473* (2026.01); *H10W 40/255* (2026.01); *H10W 74/111* (2026.01); *H10W 76/136* (2026.01)

(58) Field of Classification Search

None

See application file for complete search history.

(56) References Cited

U.S. PATENT DOCUMENTS

2003/0178632 A1* 9/2003 Hohn .................. H10H 20/854 257/E33.059
2004/0067366 A1 4/2004 Gorczyca
2015/0303336 A1* 10/2015 Lefebvre .............. H10F 77/126 136/259
2017/0275453 A1* 9/2017 Nakamata .............. C08L 63/00
2021/0191552 A1* 6/2021 Bok ...................... G06F 1/1643
2022/0044980 A1* 2/2022 Sato ....................... H01L 33/62

FOREIGN PATENT DOCUMENTS

| | | | | |
|---|---|---|---|---|
| JP | 2003-309229 A | | 10/2003 | |
| JP | 2004-277697 A | | 10/2004 | |
| JP | 2006-328231 A | | 12/2006 | |
| JP | 2007-080928 A | * | 3/2007 | ............ H01L 23/12 |
| JP | 2009-99784 A | | 5/2009 | |
| JP | 2019-29507 A | | 2/2019 | |
| JP | 2021-101455 A | | 7/2021 | |
| WO | 2021/132578 A1 | | 7/2021 | |

OTHER PUBLICATIONS

Tinuvin 928 UV Absorber Datasheet (Year: 2019).*

(Continued)

*Primary Examiner* — Dale E Page
*Assistant Examiner* — Derek L Nielsen

(57) ABSTRACT

A semiconductor device is extremely reliable because a sealant thereof is difficult to deteriorate even when a SiC semiconductor element is energized. The semiconductor device is produced by sealing a SiC semiconductor element 11 mounted on a multilayer substrate 12 and electrically conductive connection members 14 and 18 with a sealant 20 containing an ultraviolet light absorbent.

17 Claims, 2 Drawing Sheets

(56) References Cited

OTHER PUBLICATIONS

Nikafshar S, Zabihi O, Ahmadi M, Mirmohseni A, Taseidifar M, Naebe M. The Effects of UV Light on the Chemical and Mechanical Properties of a Transparent Epoxy-Diamine System in the Presence of an Organic UV Absorber. Materials (Basel). Feb. 14, 2017;10 (2):180. (Year: 2017).*

Bernd Herzog, Katja Quass, Erika Schmidt, Stefan Muller, Helmut Luther, Physical properties of organic particulate UV absorbers used in sunscreens: II. UV-attenuating efficiency as function of particle size, Journal of Colloid and Interface Science, vol. 276, Issue 2, 2004, pp. 354-363. (Year: 2004).*

Office Action dated Mar. 14, 2025 for Japanese Application No. 2021-118288.

Japanese Office Action dated Aug. 20, 2024 for Japanese Application No. 2021-118288.

* cited by examiner

SEMICONDUCTOR DEVICE

CROSS-REFERENCE TO RELATED APPLICATION

This application claims priority from Japanese Patent Application No. 2021-118288, filed on Jul. 16, 2021, which is incorporated herein by reference in their entirety.

BACKGROUND OF THE INVENTION

Field of the Invention

The present invention relates to semiconductor devices. In particular, the present invention relates to a highly reliable semiconductor device that is less likely to have deterioration in a resin sealing SiC semiconductor elements even when SiC semiconductor elements are used.

Description of Related Art

Power semiconductor modules are used in a wide range of fields that require efficient power conversion. For example, the use of power semiconductor modules is expanding in the field of power electronics, such as industrial equipment, electric vehicles, and home appliances. Such a power semiconductor module contains switching elements and diodes, and silicon (Si) semiconductor elements or silicon carbide (SiC) semiconductor elements are used as the elements.

In particular, SiC semiconductor elements have about 10 times higher dielectric breakdown field strength than Si semiconductor elements, and therefore, enable a power device having a high withstand voltage of 600 V to several thousand volts to be fabricated with a higher impurity concentration and a thinner drift layer than Si semiconductor elements. Accordingly, SiC semiconductor elements are being used in practice in high withstand voltage devices with very low on-resistance per unit area.

Conventionally, resins containing a variety of functional materials have been known as sealants for semiconductor elements. In particular, resins containing ultraviolet light absorbent are known for the purpose of sealing optical semiconductor elements (for example, see Patent Documents 1 to 4).

PATENT DOCUMENTS

Patent Document 1: Japanese Patent Laid-Open No. 2006-328231

Patent Document 2: Japanese Patent Laid-Open No. 2003-309229

Patent Document 3: Japanese Patent Laid-Open No. 2004-277697

Patent Document 4: Japanese Patent Laid-Open No. 2009-99784

SUMMARY OF THE INVENTION

When a voltage is applied to a SiC semiconductor element for activation, the element emits ultraviolet light (UV) having wavelengths of about 360 nm to about 400 nm, exhibiting a peak at 393 nm (primary wavelength), which is equivalent to the SiC band gap. It has emerged that such UV can degrade the sealing resin for SiC semiconductor elements. More specifically, a degraded sealing resin has cracking around the chip, reducing the reliability in terms of power cycle or the like.

The present inventors found, through extensive research, that providing the sealant of a power semiconductor module including a SiC semiconductor element with an ultraviolet light absorbent in a specific manner can prevent the deterioration of the sealing resin and prevent the module from decreased reliability, thus completing the invention.

According to an embodiment, the present invention relates to a semiconductor device including a SiC semiconductor element mounted on a multilayer substrate and an electrically conductive connection member; and a sealant containing an ultraviolet light absorbent, which seals the SiC semiconductor element and the electrically conductive connection member.

In the semiconductor device, preferably, the sealant includes a thermosetting resin sealing layer. The thermosetting resin sealing layer preferably contains a thermosetting resin base material, a curing agent, an inorganic filler, and an ultraviolet light absorbent.

In an embodiment of the semiconductor device, the thermosetting resin sealing layer is preferably formed of a layer containing the thermosetting resin base material, the curing agent, the inorganic filler, and the ultraviolet light absorbent.

In an embodiment of the semiconductor device, the thermosetting resin sealing layer preferably includes a first sealing layer covering surroundings of the SiC semiconductor element, and a second sealing layer covering the first sealing layer. The first sealing layer preferably contains the thermosetting resin base material, the curing agent, the inorganic filler, and the ultraviolet light absorbent.

In an embodiment of the semiconductor device, the sealant preferably includes a primer layer covering the SiC semiconductor element and the electrically conductive connection member, and a thermosetting resin sealing layer covering the primer layer. The primer layer preferably contains an ultraviolet light absorbent.

In the semiconductor device, the ultraviolet light absorbent is preferably one, two or more selected from the group consisting of benzotriazole derivatives, benzophenone derivatives, and triazine derivatives.

In the semiconductor device including the thermosetting resin, the thermosetting resin base material preferably includes an epoxy resin base material.

In the semiconductor device including the primer layer, the primer layer preferably contains one or more resins selected from the group consisting of polyamide resins, polyimide resins, and polyamide-imide resins.

The present invention can provide a highly reliable semiconductor device in which ultraviolet light emitted from the SiC semiconductor element is absorbed to prevent deterioration of the resin forming the sealant.

DESCRIPTION OF PREFERRED EMBODIMENTS

Figure 1:
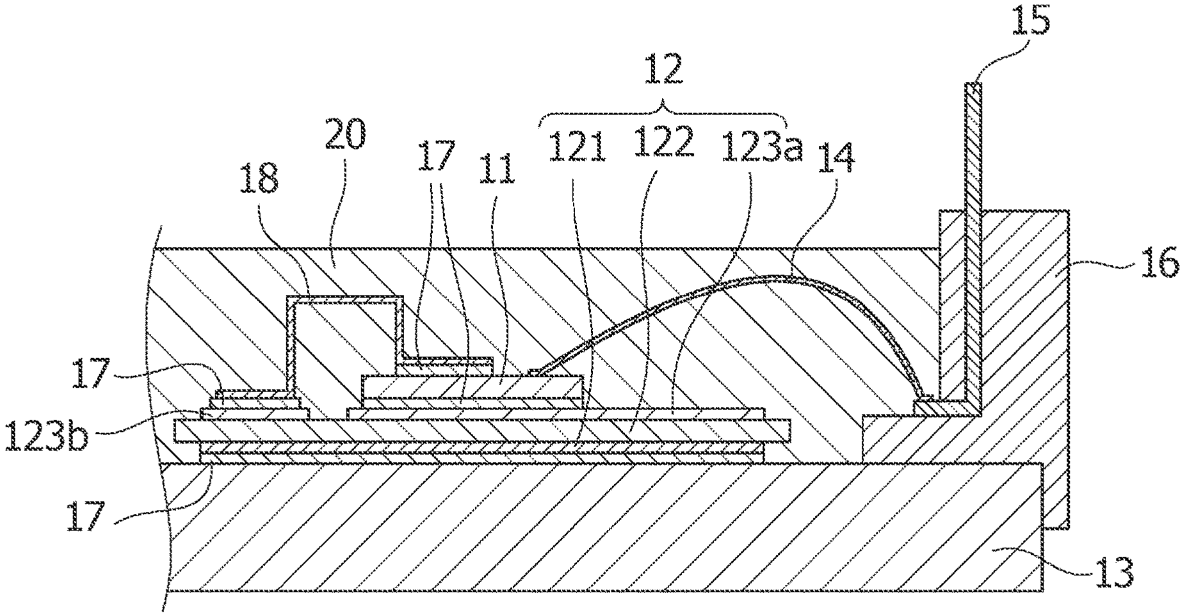
FIG. 1 is a conceptual sectional view of a semiconductor device according to a first embodiment of the present invention, illustrating the sectional structure of the semiconductor device.

Embodiments of the present invention will now be described with reference to the drawings. The present invention is, however, not limited to the embodiments described below.

An embodiment of the present invention relates to a semiconductor device. The semiconductor device according to the present embodiment includes a SiC semiconductor element mounted on a multilayer substrate and an output terminal connected by an electrically conductive connection member; and a sealant which seals these members. The sealant contains an ultraviolet light absorbent.

The sealant used herein is an insulating resin in contact at least with a SiC semiconductor element, typically with the SiC semiconductor element, an output terminal, an electrically conductive connection member, and a laminated substrate, to insulate and seal these members. Hence, the concept of the sealant disclosed herein includes both a primer layer mainly containing a thermoplastic resin and an insulating thermosetting resin layer mainly containing a thermosetting resin. However, the present invention also encompasses semiconductor devices that include a sealant mainly containing a thermosetting resin layer without including a primer layer.

In the semiconductor device of the present invention, the sealant may include one or two or more different resin layers, and at least one of the resin layers is an ultraviolet light absorption layer containing an ultraviolet light absorbent that can absorb the ultraviolet light emitted from the SiC semiconductor element. The ultraviolet light absorbent may be an organic material that can absorb 390 nm ultraviolet light. In particularly, the ultraviolet light absorbent is preferably a material that can absorb 30% or more of the ultraviolet light having a wavelength of 370 nm emitted from the SiC semiconductor element. The ultraviolet light absorption (%) of such a specific material can be measured with an ultraviolet-visible spectrophotometer. For example, a predetermined amount of an ultraviolet light absorbent is dispersed in toluene, and the transmittance of the dispersion liquid may be measured using a cell with a width of 1 cm (a length in the direction light transmits). The measurement wavelength may be varied in the range of 290 nm to 410 nm to estimate the ultraviolet light absorption (%) at 370 nm.

Specifically, compounds that can absorb 30% or more of 370 nm ultraviolet light include benzotriazole derivatives with no phenyl substituents, benzotriazole derivatives represented by formula (1) presented below, benzophenone derivatives represented by formula (2) presented below, and triazine derivatives represented by formula (3) presented below.

The benzotriazole derivative with no phenyl substituents may be a benzotriazole in which the H at the 1 or 3 position is substituted by OH and the H at the 5- or 6-position by a fluoromethyl group. Preferably, the fluoromethyl group is a trifluoromethyl group.

The benzotriazole derivative represented by formula (1) has a structure in which a phenyl group is bound to the N atom at the 2-position of the triazole ring, having substituents $R_1$ to $R_5$ on the phenyl group and substituents $R_6$ and $R_7$ on the triazole ring.

[Formula 1]

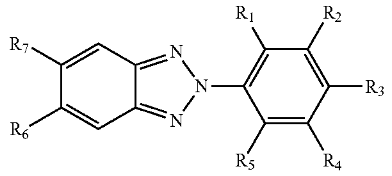

(1)

In formula (1), $R_1$ and $R_5$ each independently represent H or OH, $R_2$ and $R_4$ each independently represent H, OH, a linear or branched, saturated or unsaturated, monovalent hydrocarbon group with 1 to 6 carbon atoms, or a linear or branched, saturated, or unsaturated monovalent hydrocarbon group with 1 to 6 carbon atoms in which a hydrogen atom is substituted by a phenyl group, $R_3$ represents H, OH, or a linear or branched, saturated alkoxy group with 1 to 10 carbon atoms, and $R_6$ and $R_7$ each independently represent H or Cl.

One or two or more H atoms constructing substituents $R_1$ to $R_7$ may be substituted by Cl.

When either $R_1$ or $R_5$ is OH in formula (1), the other is preferably not OH.

When $R_2$ and/or $R_4$ is a monovalent hydrocarbon group, the monovalent hydrocarbon group may be methyl, ethyl, propyl, n-butyl, or tert-butyl, and it is preferably a tert-butyl group, which is bulkier, among these. More preferably, both $R_2$ and $R_4$ are tert-butyl. When $R_2$ and/or $R_4$ is a linear or branched, saturated or unsaturated, monovalent hydrocarbon group with 1 to 6 carbon atoms in which a hydrogen atom is substituted by a phenyl group, the hydrocarbon group is preferably a propyl group in which a H atom is substituted by a phenyl group.

When $R_3$ is an alkoxy group, the alkoxy group is preferably an octoxy group.

Specific examples of the benzotriazole derivatives include, but are not limited to, 2-(2-hydroxy-5-methylphenyl)benzotriazole, 2-(5-tert-butyl-2-hydroxyphenyl)benzotriazole, 2-(2-hydroxy-3-tert-butyl-5-methylphenyl)-5-chlorobenzotriazole, 2-(2-hydroxy-3,5-di-tert-butylphenyl) benzotriazole, 2-(2-hydroxy-3,5-di-tert-butylphenyl)-5-chloro-2H-benzotriazole, 2-(2-hydroxy-4-octoxyphenyl) benzotriazole, 2-(2H-benzotriazole-2-yl)-6-(1-methyl-1-phenylethyl)-4-(1,1,3,3-tetramethylbutyl)phenol, 1-hydroxy-6-(trifluoromethyl)benzotriazole, and 2-[2-hydroxy-3,5-bis(α,α-dimethylbenzyl)phenyl]-2H-benzotriazole.

Benzophenone derivatives are represented by the following formula (2):

[Formula 2]

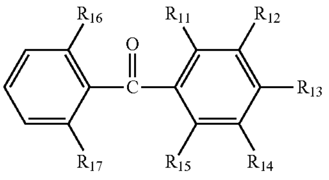

(2)

In formula (2), $R_{11}$, $R_{12}$, $R_{13}$, $R_{14}$, $R_{15}$, $R_{16}$, and $R_{17}$ are each independently selected from H, OH, and linear or branched, saturated or unsaturated, hydrocarbon groups with 1 to 3 carbon atoms.

One or more of $R_{11}$ to $R_{17}$ is selected from OH, linear or branched alkyl groups with 1 to 3 carbon atoms, and linear or branched, saturated or unsaturated, alkoxy groups with 1 to 3 carbon atoms. One or two or more H atoms forming these substituents may be substituted by Cl.

Preferably, in formula (2), either $R_{11}$ and $R_{15}$ is OH, and/or either $R_{16}$ or $R_{17}$ is OH In this instance, preferably, both $R_{11}$ and $R_{15}$ are not OH at the same time and both $R_{16}$ and $R_{17}$ are not OH at the same time.

Preferably, either $R_{13}$ or $R_{14}$ is an alkyl group or an alkoxy group, and the other is H or OH. The alkyl group is preferably a methyl group. Also, the alkoxy group is preferably a methoxy group or an allyloxy group.

Specific examples of benzophenone derivatives include, but are not limited to, 2-hydroxy-4-methylbenzophenone, 2-hydroxy-4-methoxybenzophenone, 4-(allyloxy)benzophenone, and 2,2'-dihydroxy-4-methoxybenzophenone.

The triazine derivative represented by formula (3) has a structure in which a substituted or unsubstituted phenyl group is bound to each of the three carbon atoms of 1,3,5-triazine.

[Formula 3]

(3)

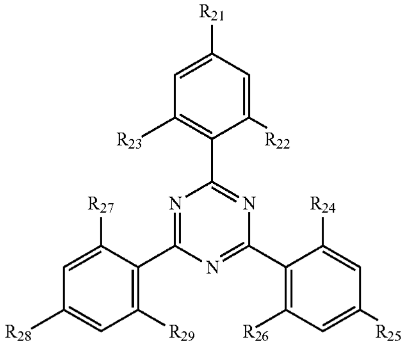

In formula (3), $R_{21}$, $R_{22}$, $R_{23}$, $R_{24}$, $R_{25}$, $R_{26}$, $R_{27}$, $R_{28}$, and $R_{29}$ are each independently selected from H, OH, linear or branched alkoxy groups with 1 to 8 carbon atoms, and linear or branched alkyl groups with 1 to 3 carbon atoms, provided that one or more substituents of $R_{21}$ to $R_{29}$ are selected from OH, linear or branched alkoxy groups with 1 to 8 carbon atoms and linear or branched alkyl groups with 1 to 3 carbon atoms. One or two or more H atoms forming these substituents may be substituted by Cl.

Preferably, at least one, more preferably two, or all three, of one substituent of $R_{23}$ and $R_{22}$, one substituent of $R_{24}$ and $R_{26}$, and one substituent of $R_{27}$ and $R_{29}$ is OH. In this instance, preferably, both $R_{23}$ and $R_{22}$ are not OH at the same time, both $R_{24}$ and $R_{26}$ are not OH at the same time, and both $R_{27}$ and $R_{29}$ are not OH at the same time.

Preferably, at least one of $R_{21}$, $R_{25}$, and $R_{28}$ is a linear or branched alkyl group with 1 to 3 carbon atoms. More preferably, this alkyl group is a methyl group. Furthermore, at least one of $R_{21}$, $R_{25}$, and $R_{28}$ is preferably an alkoxy group. More preferably, two or all of $R_{21}$, $R_{25}$, and $R_{28}$ are alkoxy groups. Still more preferably, the alkoxy group is a butoxy group or an octyloxy group. One or two of $R_{21}$, $R_{25}$, and $R_{28}$ may be an alkyl group, and the rest may be an alkoxy group.

Specific examples of triazine derivatives include, but are not limited to, 2-(2,4-dihydroxyphenyl)-4,6-diphenyl-1,3,5-triazine, 2,4,6-tris(2,4-dihydroxyphenyl)-1,3,5-triazine, 2-(2,4-dihydroxyphenyl)-4,6-bis(2,4-dimethylphenyl)-1,3,5-triazine, 2-(2-hydroxy-4-methoxyphenyl)-4,6-diphenyl-1,3,5-triazine, 2,4-bis(2,4-dimethylphenyl)-6-(2-hydroxy-4-n-octyloxyphenyl)-1,3,5-triazine, 2,4,6-tris(4-butoxy-2-hydroxyphenyl)-1,3,5-triazine, and 2,4-bis(2-hydroxy-4-butoxyphenyl)-6-(2,4-bis-butoxyphenyl)-1,3,5-triazine.

The benzotriazole, benzophenone, and triazine derivatives described above contain hydrophobic alkyl or phenyl groups and are therefore highly dispersible in the matrix resin (thermosetting resin or thermoplastic resin) of the ultraviolet light absorption layer. Many of these ultraviolet light absorbents are unlikely to react with the matrix resin such as epoxy resin, phenol resin, or maleimide resin. The ultraviolet light absorbent in the ultraviolet light absorption layer also holds particles or the like separate from the matrix resin even if the ultraviolet light absorbent melts after curing. Alkoxy group-containing derivatives are highly reactive and likely to bind to the inorganic filler or any other inorganic material contained in the ultraviolet light absorption layer, or Cu or the like contained in the members that may contact the ultraviolet light absorption layer.

The ultraviolet light absorbent can be dispersed in the matrix resin (thermosetting resin or thermoplastic resin) of the ultraviolet light absorption layer. In view of the dispersibility, the average particle size of the ultraviolet light absorbent may be 10 nm to 5000 nm and is preferably 50 nm to 500 nm. In particular, the ultraviolet light absorbent of a benzotriazole derivative may have an average particle size of 10 nm to 1000 nm, preferably 50 nm to 200 nm. Benzotriazole derivatives and triazine derivatives do not form covalent bonds with the matrix resin and have high melting points. Such an ultraviolet light absorbent holds particles separate from the matrix resin even if the ultraviolet light absorbent melts after curing. Accordingly, the particle size of the ultraviolet light absorbent can be controlled to be smaller than that of the inorganic filler to increase the dispersibility.

In the present invention, the ultraviolet light sealing layer can be provided in several ways in the sealant. The present invention will be further described in detail with reference to a first, a second, and a third embodiment in which the ultraviolet light sealing layer is disposed in different ways.

First Embodiment

In the semiconductor device according to a first embodiment, the sealant includes a thermosetting resin sealing layer. The thermosetting resin sealing layer consists of a layer containing a thermosetting resin base material, a curing agent, an inorganic filler, and an ultraviolet light absorbent.

FIG. 1 is a conceptual sectional view of a power semiconductor module that is an implementation of the semiconductor device according to the first embodiment of the present invention. The illustrated power semiconductor module has a multilayer structure in which a SiC semiconductor element 11 and a laminated substrate 12 are bonded together on a heat sink 13 with a bonding layer 17. A case 16 having an external terminal 15 therein is bonded to the heat sink 13. An electrode of the SiC semiconductor element 11 and an electrode of the laminated substrate 12 are connected to each other by a lead frame 18 acting as an electrically conductive connection member. The SiC semiconductor element 11 and the external terminal 15 are connected by an aluminum wire 14. A thermosetting resin sealing layer 20 is filled on the SiC semiconductor element 11 and laminated substrate 12, the lead frame 18, and electrically conductive connection members including the aluminum wire 14 in such a manner as to contact with these members. Hence, the sealant consists essentially of the thermosetting resin sealing layer 20, and the thermosetting resin sealing layer 20 functions as an ultraviolet light absorption layer.

The SiC semiconductor element 11 is an insulated gate bipolar transistor (IGBT) chip, a diode chip, or any other power chip. A semiconductor element used may be a combination of Si devices and wide gap semiconductor devices, such as GaN devices, diamond devices, or ZnO devices. For example, a hybrid module using a Si-IGBT and a SiC Schottky barrier diode (SiC-SBD) may be used. The number of the SiC semiconductor elements 11 to be mounted may be one or two or more.

The laminated substrate 12 may be composed of an insulation substrate 122, a first electrically conductive plate 121 with a predetermined form (pattern) formed on one of the main surfaces of the insulation substrate, and second electrically conductive plates 123*a* and 123*b* formed on the other main surface. A material excellent in electrical insulation and thermal conductivity may be used as the insulation substrate 122. Examples of the material of the insulation substrate 122 include $Al_2O_3$, AlN, and SiN. For usage requiring high withstand voltage, in particular, materials satisfying both electrical insulation and thermal conductivity are preferred, and AlN and SiN may be used, but they are not limited to these materials. The first electrically conductive plate 121 and the second electrically conductive plates 123*a* and 123*b* may be made of a metal material having excellent workability, such as Cu or Al. For rust prevention, the electrically conductive plates may be made of Ni-plated Cu or Al or the like. The electrically conductive plates 121, 123*a*, and 123*b* may be disposed on the insulation substrate 122 by direct copper bonding or active metal brazing. In the illustrated embodiment, the two second electrically conductive plates 123*a* and 123*b* are disposed in a discontinuous manner on the insulation substrate 122. One (123*a*) of the second electrically conductive plate may function as an electrode to be connected to the SiC semiconductor element 11, and the other (123*b*) may function as an electrode to be connected to the lead frame 18.

The lead frame 18 is an electrically conductive connection member connecting the SiC semiconductor element 11, the second electrically conductive plate 123*b*, and the like to each other. More specifically, the lead frame 18 is bonded to an electrode (surface electrode) of the SiC semiconductor element 11 by a bonding layer 17 made of a solder material or the like. The lead frame 18 is also bonded to the second electrically conductive plate 123*b* and other wring members by a bonding layer 17 made of a solder material or the like. The lead frame 18 may be a metal, such as copper or an alloy containing copper. The lead frame 18 may be provided with a Ni or Ni alloy layer or a Cr or Cr alloy layer on the surface thereof by plating. In this instance, the thickness of the Ni or Ni alloy layer or the Cr or Cr alloy layer may be about not more than 20 μm. The electrically conductive connection member connecting the SiC semiconductor element 11 to the second electrically conductive plate 123*b* and the like may be a lead terminal having a pin shape or a wire, such as an aluminum or copper wire, used for wire bonding, instead of the lead frame.

The heat sink 13 may be made of a thermally conductive metal, such as copper or aluminum. Also, the heat sink 13 may be coated with Ni or an Ni alloy for rust prevention. A heat sink used here may be a cooling device with water cooling or air cooling capability.

The bonding layer 17 may be formed by using a lead-free solder. For example, an Sn—Ag—Cu, Sn—Sb, Sn—Sb—Ag, Sn—Cu, Sn—Sb—Ag—Cu, Sn—Cu—Ni, Sn—Ag, or similar solder may be used, but the lead-free solder is not limited to these. Alternatively, a bonding layer used here may be formed by using a bonding material containing sintered silver nanoparticles or other fine metal particles.

The case 16 may be made of a thermoplastic resin, such as polyphenylene sulfide (PPS) or polybutylene terephthalate (PBT).

In the present embodiment, the SiC semiconductor element 11, the laminated substrate 12, and the electrically conductive connection members including the lead frame 18 and the aluminum wire 14 may be referred to as members to be sealed. The space over the members to be sealed is filled with the sealant formed of the thermosetting resin sealing layer 20. Thus, the thermosetting resin sealing layer 20 contacts the SiC semiconductor element 11, the laminated substrate 12, and the electrically conductive connection members to cover the surroundings of these members to be sealed. The thickness of the thermosetting resin sealing layer 20 varies depending on the shape or the like of the module and may be about 0.1 mm to 2 mm.

The thermosetting resin sealing layer 20 is a cured product of a thermosetting resin composition containing a thermosetting resin base material, a curing agent, an ultraviolet light absorbent, and an inorganic filler, and optionally, a curing accelerator and other additives.

Examples of the thermosetting resin base material include, but are not limited to, epoxy, phenol, and maleimide resins which have heat resistance and high insulation. Among others, epoxy resins having at least two epoxy groups in the molecule is particularly preferable. Such epoxy resins are dimensionally stable, resistant to water and chemicals, and highly electrically insulative. Specifically, an aliphatic epoxy resin, an alicyclic epoxy resin, or a mixture thereof is preferably used.

An aliphatic epoxy resin refers to an epoxy compound in which the carbon atom bound directly to the epoxy group is a carbon atom forming an aliphatic hydrocarbon. Therefore, provided that the same holds true, even a compound having an aromatic ring in the backbone is also an aliphatic epoxy resin. Examples of aliphatic epoxy resins include, but are not limited to, bisphenol A epoxy resin, bisphenol F epoxy resin, bisphenol AD epoxy resin, biphenyl epoxy resin, naphthalene epoxy resin, cresol novolac epoxy resin, and trifunctional or more polyfunctional epoxy resins. These epoxy resins may be used singly or in combination of two or more. Naphthalene epoxy resin and trifunctional or more polyfunctional epoxy resins have high glass transition temperatures and are accordingly referred to as highly heat-resistant epoxy resins. Using such a highly heat-resistant epoxy resin can enhance heat resistance.

An alicyclic epoxy resin refers to an epoxy compound in which the two carbon atoms of the epoxy group are members forming an alicyclic compound. Alicyclic epoxy resins include, but are not limited to, monofunctional epoxy resin, bifunctional epoxy resin, and trifunctional or higher polyfunctional epoxy resins. Alicyclic epoxy resins may also be used singly or in combination of two or more. Mixing an alicyclic epoxy resin with an acid anhydride curing agent and curing the mixture forms a product with a high glass transition temperature. Accordingly, mixing an aliphatic epoxy resin with an alicyclic epoxy resin can form a product with a higher heat resistance.

The thermosetting resin base material used in the thermosetting resin sealing layer 20 may be a mixture of the above-described aliphatic epoxy resins and alicyclic epoxy resins. Aliphatic epoxy resin and alicyclic epoxy resin may be mixed in any proportion and may be, but is not limited to, in a mass ratio of about 2:8 to 8:2 or about 3:7 to 7:3. In a preferred embodiment, the thermosetting resin base material used in the thermosetting resin sealing layer 20 is a mixture of bisphenol A epoxy resin and alicyclic epoxy resin in a mass ratio of 1:1 to 1:4.

The thermosetting resin sealing layer 20 preferably contains 0.1 parts to 10 parts by mass, more preferably 1 part to 5 parts by mass, of an ultraviolet light absorbent relative to 100 parts by mass of the matrix resin of the thermosetting resin sealing layer 20 in view of reliability. The matrix resin used in the present embodiment contains the thermosetting resin base material and the curing agent, but not the inorganic filler. In general, the ultraviolet light absorbent can be uniformly dispersed in the thermosetting resin sealing layer 20 in the above-mentioned range of content. However, the concentration of the ultraviolet light absorbent may vary among portions of the thermosetting resin sealing layer 20 and is preferably set to be higher in the vicinity of the semiconductor element 11. In the first embodiment, the thermosetting resin sealing layer 20 preferably contains an ultraviolet light absorbent having one or more OH groups selected from the ultraviolet light absorbents represented by general formulas (1), (2), and (3). This produces an additional effect that when the thermosetting resin sealing layer 20 comes into contact with the electrically conductive plate 123*a* of the laminated substrate 12 and other members, the adhesion can be enhanced.

The inorganic filler essentially contained in the thermosetting resin sealing layer 20 may be a metal oxide or metal nitride having a high thermal conductivity and a low linear expansion coefficient. Examples of such an inorganic filler include, but are not limited to, fused silica, silica (silicon oxide), alumina, aluminum hydroxide, titania, zirconia, aluminum nitride, talc, clay, mica, and glass fiber. The inorganic filler can increase the thermal conductivity of the thermosetting resin sealing layer 20 and reduce the thermal expansion coefficient. The thermosetting resin sealing layer 20 is preferably electrically insulative. Accordingly, the inorganic filler is also preferably insulative. Inorganic fillers may be used singly or in combination of two or more as a mixture. The inorganic filler may be a microfiller, a nanofiller, or a mixture of two or more inorganic fillers of different particle size and/or material. Preferably, the inorganic filler has an average particle size of about 0.2 μm to 20 μm. The amount of the inorganic filler added in the thermosetting resin sealing layer 20 is preferably 100 parts to 600 parts by mass, more preferably 200 parts to 400 parts by mass, relative to 100 parts by mass of the matrix resin. When the amount of the inorganic filler added is less than 100 parts by mass, the thermal expansion coefficient of the thermosetting resin sealing layer 20 is likely to increase, causing peeling and cracking. In contrast, when the amount of the inorganic filler is greater than 600 parts by mass, the composition has an increased viscosity and can be difficult to extrude.

The curing agent essentially contained in the thermosetting resin sealing layer 20 is reactive to the thermosetting resin base material, preferably epoxy resin base material, to cure the base material and is not otherwise limited. Preferably, an acid anhydride-based curing agent is used. Examples of the acid anhydride-based curing agent include aromatic acid anhydrides, such as phthalic anhydride, pyromellitic anhydride, and trimellitic anhydride. Other examples include cyclic aliphatic acid anhydrides, such as tetrahydrophthalic anhydride, methyltetrahydrophthalic anhydride, hexahydrophthalic anhydride, methylhexahydrophthalic anhydride, and methylnadic anhydride; and aliphatic acid anhydrides, such as succinic anhydride, polyadipic anhydride, polysebacic anhydride, and polyazelaic anhydride. Preferably, the curing agent is added in a proportion of about not less than 50 parts and not greater than 170 parts by mass, more preferably about not less than 80 parts and not greater than 150 parts by mass, relative to 100 parts by mass of the epoxy resin base material. When the proportion of the curing agent is less than 50 parts by mass, the thermosetting resin cannot have sufficient crosslinks, resulting in reduced glass transition temperature. When the proportion of the curing agent exceeds 170 parts by mass, the thermosetting resin may deteriorate in moisture resistance, heat resistance, and heat stability. In an embodiment using a bisphenol A epoxy resin independently or using a mixture of a bisphenol A epoxy resin and any of the above-cited highly heat-resistant epoxy resins, it may be preferable not to use the curing resin from the viewpoint of increasing the heat resistance. The highly heat-resistant epoxy resin may be added in a proportion of, for example, not less than 10% and not more than 50% by mass, preferably not less than 10% and not more than 25% by mass, relative to 100% by mass in total of the thermosetting resin base materials. In such a range, the heat resistance is preferably increased without increasing the viscosity.

The thermosetting resin composition forming the thermosetting resin sealing layer 20 may optionally contain a curing accelerator. Examples of the curing accelerator include imidazole and its derivatives, tertiary amines, boric acid esters, Lewis acids, organic metal compounds, and organic acid metal salts, and any one of them can be added if necessary. Preferably, the curing accelerator is added in a proportion of about 0.01 part or more and 50 parts or less by mass, more preferably about 0.1 parts or more and 20 parts or less by mass, relative to 100 parts by mass of the thermosetting resin base material.

The thermosetting resin composition forming the thermosetting resin sealing layer 20 may optionally contain other additives as long as the properties thereof are not inhibited. Such additives include, but are not limited to, a flame retardant, a pigment for coloring the resin, and a plasticizer or silicone elastomer to enhance crack resistance. Such optionally added constituents and their content can be appropriately determined by those skilled in the art according to the specifications required for the semiconductor device and/or the thermosetting resin sealing layer 20.

The process for producing the illustrated power semiconductor module will now be described. After bonding the heat sink 13, the laminated substrate 12, and the SiC semiconductor element 11 together and attaching the case 16 to the heat sink 13, the lead frame 18 is bonded, and wire bonding process is performed using the aluminum wire 14. Then, a thermosetting resin composition to form the thermosetting resin sealing layer 20 is injected into the case 16, followed by heat curing. The heat curing may be conducted, for example, in two stages. In an embodiment using an epoxy resin as the thermosetting resin base material, the thermosetting resin composition may be heated at 90° C. to 120° C. for 1 to 2 hours to be brought into a semi-cured state (preliminary curing). Subsequently, the semi-cured composition is further heated at 175° C. to 185° C. for 1 to 2 hours (full curing). The full curing may be performed by continuously increasing temperature from the temperature for the preliminary curing. The temperature and time for the heat curing are not limited to specific values, and the two-stage curing is not necessarily required. For preliminary curing, preferably, the temperature is slowly increased from room temperature at a rate of 0.5° C./min to 2° C./min. This manner increases the dispersibility of the ultraviolet light absorbent, thus increasing the reliability of the resulting module.

In a modification of the illustrated power semiconductor module, the sealant may further include a primer layer. The primer layer may be disposed at the interface between the thermosetting resin sealing layer 20 and the members to be sealed including the laminated substrate, the semiconductor element, and the electrically conductive connection members. The primer layer can relieve stress at the interface between the thermosetting resin sealing layer 20 and the sealed members and may be preferably used from the viewpoint of ensuring adhesion. The primer layer may be made of a resin containing polyamide, polyimide, or polyamide-imide. Resins containing polyamide, polyimide, or polyamide-imide are referred to as primer material. Polyimide is a general term for polymer compounds containing imide bonds. A polymer having a cyclic imide structure is preferable. Examples of the polyimide that can be used include, but are not limited to, PMDA/4,4'-ODA (copolymer of pyromellitic dianhydride and 4,4'-oxydianiline), BPDA/PDA (copolymer of 3,3',4,4'-biphenyltetracarboxylic dianhydride and p-phenylenediamine), and BPDA/4,4'-ODA (copolymer of 3,3',4,4'-biphenyltetracarboxylic dianhydride and 4,4'-oxydianiline). Polyamide is a general term for polymer compounds containing amide bonds, and polyamide-imide is a general term for polymer compounds containing both imide bonds and amide bonds.

In the modification of the first embodiment, the primer layer may contain, but need not contain, an ultraviolet light absorbent. The primer layer may be formed to any thickness, provided that the primer layer functions to enhance adhesion. For the primer layer containing no ultraviolet light absorbent, the thickness may be, for example, about 1 μm to 20 μm and is preferably 1 μm to 10 μm. The primer layer with such a thickness can relieve stress and enhance adhesion, thus being advantageous. The primer layer may be provided to cover the entirety of the surfaces of the SiC semiconductor element 11, laminated substrate 12, lead frame 18, and aluminum wire 14, illustrated in FIG. 1. The primer layer may contain silica or any other inorganic filler to, for example, control the linear expansion coefficient. In this instance, the inorganic filler may have an average particle size of 10 nm to 1000 nm and may be added in a range of 0.5 parts to 3 parts by mass relative to 100 parts by mass of the primer layer material. The inorganic filler in such ranges does not inhibit the effect of a primer to relieve stress.

In another modification of the first embodiment, the sealant may further include one or more additional resin sealing layers other than the thermosetting resin sealing layer. For example, the sealant may include a thermoplastic resin layer which can cover the air-contacting surface of the thermosetting resin sealing layer 20. In this modification, a primer layer may or may not be provided.

In a process for producing the power semiconductor module including the primer layer, the primer layer is formed after assembling the members to be sealed and before injecting the thermosetting resin composition to form the thermosetting resin sealing layer 20. The primer layer may be formed over the entire surfaces of the members to be sealed depicted in FIG. 1, including the SiC semiconductor element 11, the lead frame 18, the laminated substrate 12, the aluminum wire 14, and the case 16 by, for example, spray coating, dip coating, or using a dispenser. After the formation of the primer layer, the resulting structure is preferably heated in a nitrogen inert gas oven in stages at 70° C. to 100° C. for about 60 min to 80 min and at 200° C. to 220° C. for 60 min to 80 min. This heating operation heats the Cu of the lead frame 18 and evaporates the solvent to solidify the primer. After the primer layer is thus formed, the resulting structure can be subjected to insulation and encapsulation with the thermosetting resin sealing layer 20 in the same manner as the process for producing the power semiconductor module depicted in FIG. 1. When optional additional resin sealing layers are provided, they may be formed in ordinary manners.

The structure of the illustrated power semiconductor module is merely an example and is not intended to limit the present invention. For example, any electrically conductive connection members may be used, and implant pins may be used. Only the lead frame or the wire may be the electrically conductive member. In a modification of the semiconductor module in which the electrically conductive connection members include an implant pin, when the primer layer is provided, it may cover the surface of the implant pin. In a modification of the semiconductor module in which only the wire is the electrically conductive connection member, when the primer layer is provided, it may cover the surface of the wire.

The power semiconductor module may be a caseless module including no case. The caseless power semiconductor module (not shown) may include an implant pin and a printed substrate bonded to the implant pin, instead of the lead frame and the aluminum wire depicted in FIG. 1, and the members to be sealed, including these connection members are sealed with the thermosetting resin sealing layer. The printed substrate may be a polyimide or epoxy film provided with a Cu or Al electrically conductive layer or the like on the film. The implant pin may be a copper pin including copper. The Cu or Al of the implant pin and of the electrically conductive layer of the printed substrate may be plated with Ni or the like for rust prevention. The printed substrate and implant pin electrically connect the semiconductor elements one to another or the semiconductor element to the laminated substrate. The implant pin and the laminated substrate or the semiconductor element may be bonded with a solder bonding layer therebetween. The implant pin can be led out from the laminated substrate out of the thermosetting resin sealing layer and thus connected to an external connection terminal. For producing such a caseless power semiconductor module, the member to be sealed, including the laminated substrate, the semiconductor element, the implant pin, and the printed substrate, are assembled, and optionally a primer layer is formed over the laminated substrate, the semiconductor element, the implant pin, and the printed substrate by, for example, spray coating. The assembly of those members is placed in an appropriate mold, and the mold is filled with the thermosetting resin composition for forming the thermosetting resin sealing layer, followed by curing. Such a sealant may be formed by, but is not limited to, vacuum injection, transfer molding, liquid transfer molding, potting, or any other forming technique.

In the present embodiment, substantially the entirety of the thermosetting resin sealing layer acts as the ultraviolet light absorption layer. The present embodiment is advantageous for preventing the deterioration of the sealing resin by ultraviolet light without increasing the number of process steps.

Second Embodiment

In the semiconductor device according to a second embodiment, the sealant includes a thermosetting resin sealing layer. The thermosetting resin sealing layer includes a first sealing layer covering the surroundings of the SiC semiconductor element, and a second sealing layer covering the first sealing layer. The first sealing layer (ultraviolet light absorption layer) contains a thermosetting resin base material, a curing agent, an inorganic filler, and an ultraviolet light absorbent. Hence, in the second embodiment, one or some of the layers defining the thermosetting resin sealing layer function as an ultraviolet light absorption layer.

Figure 2:
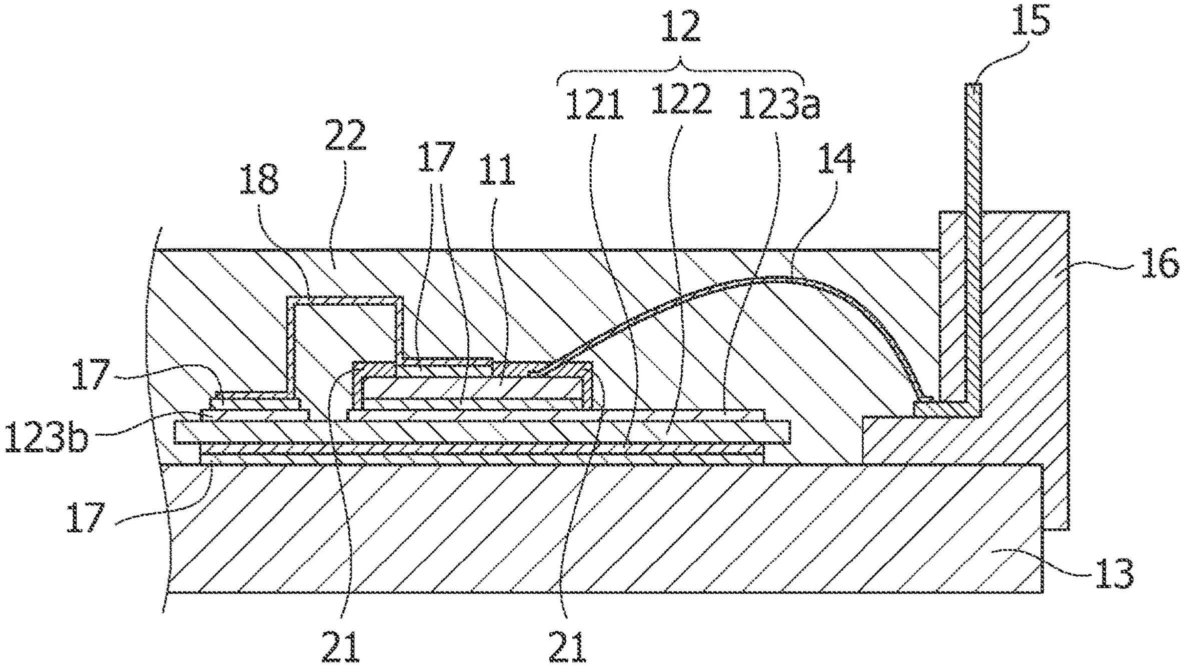
FIG. 2 is a conceptual sectional view of a semiconductor device according to a second embodiment of the present invention, illustrating the sectional structure of the semiconductor device.

FIG. 2 is a conceptual sectional view of a power semiconductor module that is an implementation of the semiconductor device according to the second embodiment of the present invention. In the illustrated power semiconductor module, a first sealing layer 21 is formed in contact with a SiC semiconductor element 11, a laminated substrate 12, a lead frame 18, electrically conductive connection members including an aluminum wire 14, and other members to be sealed, and a second sealing layer 22 is formed around the first sealing layer 21 and the members to be sealed. In other words, the sealant is formed of a thermosetting resin sealing layer, and the thermosetting resin sealing layer includes the first sealing layer 21 and the second sealing layer 22. The SiC semiconductor element 11 is bonded onto the second electrically conductive plate 123*a* of the laminated substrate 12 with a bonding layer 17 made of a solder material or the like therebetween. Since ultraviolet light is emitted mainly through one or more lateral faces of the SiC element, the first sealing layer 21 covers at least the one or more lateral faces of the SiC semiconductor element 11 and may cover the top face of the SiC semiconductor element 11. Also, the first sealing layer 21 may be disposed to cover one or more exposed ends of the bonding layer 17 and contact the second electrically conductive plate 123*a*. In a structure in which the first sealing layer 21 contacts the second electrically conductive plate 123*a*, the contact portion with the second electrically conductive plate 123*a* preferably has a length of 0.5 mm to 1.0 mm in view of adhesion. The length of the contact portion refers to the length from the exposed end of the bonding layer 17 in contact with the second electrically conductive plate 123*a* to the end of the first sealing layer 21 along the second electrically conductive plate 123*a*. Also, the first sealing layer 21 may be applied to contact the insulation substrate 122 of the laminated substrate 12.

In the embodiment illustrated in FIG. 2, typically, only the first sealing layer 21 is in contact with the SiC semiconductor element 11, and the second sealing layer 22 does not contact the SiC semiconductor element 11. The first sealing layer 21 may have the same composition as the thermosetting resin sealing layer 20 of the first embodiment. The thickness of the first sealing layer 21 is preferably 2 μm to 1000 μm and more preferably 100 μm to 1000 μm. The thickness mentioned here is the thickness of the first sealing layer 21 when covering the lateral and top faces of the SiC semiconductor element 11. In view of reliability, the first sealing layer 21 preferably contains 0.1 parts to 10 parts by mass, more preferably 1 part to 5 parts by mass, of an ultraviolet light absorbent relative to 100 parts by mass of the matrix resin of the first sealing layer 21. The matrix resin used in the present embodiment refers to a concept which contains the thermosetting resin base material and the curing agent, but not the inorganic filler. In general, the ultraviolet light absorbent is uniformly dispersed in the first sealing layer 21 in the above-mentioned content range. However, the concentration of the ultraviolet light absorbent may be varied among portions of the first sealing layer 21 and is preferably higher in the vicinity of the semiconductor element 11. Alternatively, the ultraviolet light absorbent may be added in the same amount as in the first embodiment.

The first sealing layer 21 contacts part of the electrically conductive member, such as the lead frame 18, connected to the top face of the SiC semiconductor element 11 and may or may not cover the entirety of the lead frame 18. The lead frame and other electrically conductive members are typically made of copper or aluminum. Such material does not transmit ultraviolet light emitted from the SiC semiconductor element 11 and need not be covered. In the second embodiment, the first sealing layer 21 preferably contains an ultraviolet light absorbent having one or more OH groups selected from the ultraviolet light absorbents represented by formulas (1), (2), and (3). This produces an additional effect that when the first sealing layer 21 comes into contact with the electrically conductive plate 123*a* of the laminated substrate 12 and other members, the adhesion can be enhanced.

The second sealing layer 22 contains a thermosetting resin base material, a curing agent, and an inorganic filler. The ultraviolet light absorbent may or may not be contained, and if it is contained, the amount is smaller than in the first sealing layer 21. The thermosetting resin base material and the curing agent in the second sealing layer 22 are preferably the same as those in the first sealing layer 21. Thus, the linear expansion coefficients of the first sealing layer 21 and the second sealing layer 22 can be the same level, preventing separation at the interface between the first sealing layer 21 and the second sealing layer 22. For the same reason, the type and content of the inorganic filler of the second sealing layer 22 are preferably the same as those of the first sealing layer 21.

In the second embodiment, a primer layer (not shown) may be provided between the first sealing layer 21 and the members to be sealed including the SiC semiconductor element 11 or between the second sealing layer 22 and the laminated substrate and other members to be sealed. The composition and thickness of the primer layer may be the same as in the first embodiment.

The semiconductor device of the second embodiment may be produced in the same manner as in the first embodiment, except for the step of forming the sealant. In the second embodiment, the first sealing layer 21 is formed, optionally followed by preliminary curing, and then the second sealing layer 22 is formed. After the preliminary curing and full curing of the first sealing layer 21, the second sealing layer 22 may be formed, followed by preliminary curing and full curing. However, in view of the adhesion between the first sealing layer 21 and the second sealing layer 22, the second sealing layer 22 is preferably formed after the preliminary curing of the first sealing layer 21 and is then subjected to preliminary curing and full curing. The first sealing layer 21 may be formed by, but is not limited to, spray coating or using a dispenser. The semiconductor device of the second embodiment can be modified in the same manner as in the modifications of the first embodiment.

In the semiconductor device according to the second embodiment of the present invention, a thermosetting resin sealing layer partially containing an ultraviolet light absorbent is disposed around the SiC semiconductor element. This structure enables the ultraviolet light absorbent to efficiently absorb ultraviolet light even in a small amount and protects the sealing resin with adhesion at the interfaces maintained. Ultraviolet light absorbents are difficult to react with thermosetting resin, notably epoxy resin. When the layer containing an ultraviolet light absorbent is large, the dispersion of the ultraviolet light absorbent may not be uniform. In the semiconductor device according to the second embodiment of the present invention, the layer containing an ultraviolet light absorbent (first sealing layer) is thin and small. Accordingly, a necessary and sufficient amount of ultraviolet light absorbent can probably be provided around the SiC semiconductor element.

Third Embodiment

The semiconductor device according to a third embodiment includes a SiC semiconductor element mounted on a laminated substrate and an electrically conductive connection member, and a sealant containing an ultraviolet light absorbent, which seals the SiC semiconductor element and the electrically conductive connection member. The sealant includes a primer layer and a thermosetting resin sealing layer. The primer layer contains the ultraviolet light absorbent.

Figure 3:
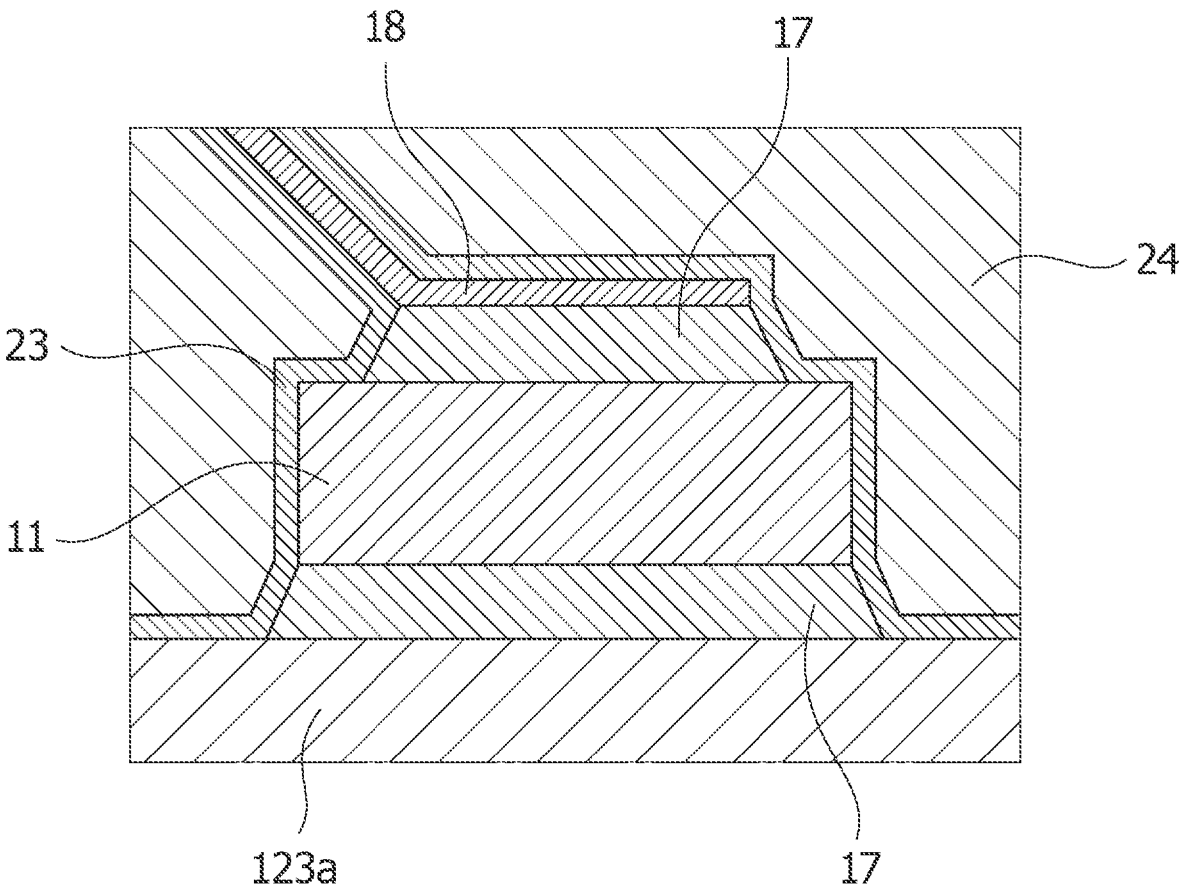
FIG. 3 is a conceptual sectional view of a semiconductor device according to a third embodiment of the present invention, illustrating the sectional structure of the semiconductor device.

FIG. 3 is a fragmentary sectional view of a power semiconductor module that is an implementation of the semiconductor device according to the third embodiment of the present invention, illustrating a SiC semiconductor element and its vicinity. In the illustrated power semiconductor module, a primer layer 23 is disposed in contact with a SiC semiconductor element 11, a second electrically conductive plate 123*a*, a lead frame 18, and other members to be sealed, and a thermosetting resin sealing layer 24 covers the primer layer 23. More specifically, the primer layer 23 covers the SiC semiconductor element 11, the laminated substrate, the lead frame 18, and other members with wiring members to be sealed. Hence, the sealant includes the primer layer 23 and the thermosetting resin sealing layer 24, and the primer layer 23 functions as an ultraviolet light absorption layer.

In the embodiment illustrated in FIG. 3, typically, only the primer layer 23 is in contact with the SiC semiconductor element 11, and the thermosetting resin sealing layer 24 does not contact the SiC semiconductor element 11. The primer layer 23 contains an ultraviolet light absorbent in addition to the composition of the primer layer described in a modification of the first embodiment. The primer layer 23 preferably contains 0.1 parts to 5 parts by mass, more preferably 0.5 parts to 2.0 parts by mass, of an ultraviolet light absorbent relative to 100 parts by mass of the matrix resin of the primer layer. The matrix resin in the primer layer used in the present embodiment contains a primer material but not the inorganic filler. The primer layer 23 may contain an inorganic filler to control the linear expansion coefficient but, preferably, contains no inorganic filler. Adding an inorganic filler in the primer layer reduces the ultraviolet light absorbent content by the amount of the inorganic filler added and may reduce the effect of relaxing stress. The ultraviolet light absorbent contained in the primer layer 23 is preferably a compound having one or more OH groups selected from the ultraviolet light absorbents represented by formulas (1), (2), and (3). Such an ultraviolet light absorbent can enhance the adhesion of the primer layer 23 to the electrically conductive plate 123*a* of the laminated substrate 12.

The thickness of the primer layer 23 is preferably 5 μm to 200 μm and more preferably 10 μm to 100 μm. The primer layer with such a thickness can absorb ultraviolet light emitted from the SiC semiconductor element 11 effectively to prevent the deterioration of the thermosetting resin sealing layer 24 while maintaining the effect of relaxing stress.

The thermosetting resin sealing layer 24 contains a thermosetting resin base material, a curing agent, and an inorganic filler. The ultraviolet light absorbent may or may not be contained, and if contained, the amount is smaller than in the primer layer 23. The thermosetting resin base material, the curing agent, and the inorganic filler in the thermosetting resin sealing layer 24 may be selected from those of the thermosetting resin sealing layer 20 described in the first embodiment. Also, the thermosetting resin sealing layer 24 may contain optional components added to the thermosetting resin sealing layer 20 of the first embodiment.

In the semiconductor device according to the third embodiment of the present invention, the primer layer contains an ultraviolet light absorbent. This structure enables the ultraviolet light absorbent to efficiently absorb ultraviolet light even in a small amount and protects the sealing resin with adhesion at interfaces maintained, without increasing the number of basic process steps. Since the layer containing an ultraviolet light absorbent (primer layer) is thinner than the layer containing an ultraviolet light absorbent of the first embodiment (thermosetting resin sealing layer), a necessary and sufficient amount of ultraviolet light absorbent can be probably provided around the SiC semiconductor element as in the second embodiment.

EXAMPLES

The present invention will now be further described in detail with reference to Examples. The present invention is, however, not limited to the following Examples.

1. Production of Semiconductor Devices

Power semiconductor modules according to the first, the second, and the third embodiments of the present invention were produced as Examples 1, 2, and 3, respectively, for evaluating the reliability of the modules. The reliability was estimated from the $T_j$ power cycle resistance ($T_j$ P/C resistance). Power cycling tests in which one cycle consisted of energized operation for 2 s and a pause for 9 s was conducted at 40° C. to 185° C. ($\Delta T_j$: 145° C.), and the number of cycles was counted until an electrical property reached an abnormal value. More specifically, the power semiconductor modules were energized from 40° C. to 185° C. For grasping the effect of ultraviolet light, the modules were examined under conditions in which the temperature of the modules was higher than usual (175° C.) and the current flowing the semiconductor element was higher. For satisfactory reliability, at least 50 kilocycles are required.

Each thermosetting resin used in the thermosetting resin sealing layer 20 of Example 1, the first sealing layer 21 and the second sealing layer 22 of Example 2, and the thermosetting resin sealing layer 24 of Example 3 was epoxy resin. Epoxy resin ME-276 (produced by Pelnox Ltd.) was used as the epoxy resin base material. To 100 parts by mass of this base material, 121 parts by mass of MV-138 (produced by Pelnox Ltd.) was added as an acid anhydride-based curing agent. Spherical silica (produced by AGC Inc.) having an average particle size of 10 μm was added as the inorganic filler in a proportion of 270 parts by mass relative to 100 parts by mass in total of the epoxy resin base material and the curing agent. In the sealing layer acting as the ultraviolet light absorption layer in Examples 1 and 2, the ultraviolet light absorbent presented in Table 1 was added in the proportion presented in the Table 1 to the matrix resin. Each content, or proportion, is represented in parts by mass relative to 100 parts by mass of the matrix resin.

In Examples 1 and 2, the primer layer was formed of HIMAL HL 1200F (Showa Denko Materials Co., Ltd.)

mainly containing polyamide over the laminated substrate, the semiconductor element, the lead frame, the wire, and the case. In Examples 1 and 2, no ultraviolet light absorbent was added into HIMAL HL1200F. In contrast, in Example 3, the ultraviolet light absorbent was added with the content presented in Table 1 into the matrix resin made of HIMAL HL1200F. The thickness of the primer layer is presented in Table 1.

In Comparative Example 1, a power semiconductor module was produced in the same manner as in Example 1, except that the thermosetting resin sealing layer contained no ultraviolet light absorbent and no primer layer was provided. In Comparative Example 2, a power semiconductor module was prepared in the same manner as in Example 3, except that the primer layer contained no ultraviolet light absorbent. Table 1 presents the compound as the ultraviolet light absorbent, the thickness (μm) of the ultraviolet light absorption layer, and the ultraviolet light absorbent content (parts by mass), and the measurement results of P/C resistance (kilocycles). The units of physical quantities in Tables 2 to 7 below are the same as those in Table 1. The presence of an ultraviolet light absorption layer increased the reliability 1.5 times to twice compared to known structures with no ultraviolet light absorption layer. Comparison among Examples 1 to 3 suggests that the reliability of the modules according to the second and third embodiments was slightly higher than that of the first embodiment. This is probably because of a uniform distribution of the ultraviolet light absorbent around the SiC semiconductor element, which emits ultraviolet light.

TABLE 1

| | Examples and Comparative Examples | | | | |
|---|---|---|---|---|---|
| | Example 1 | Example 2 | Example 3 | Comparative Example 1 | Comparative Example 2 |
| Structure | First Embodiment | Second Embodiment | Third Embodiment | None | None |
| Primer layer Thickness | HIMAL layer provided 10 μm | HIMAL layer provided 10 μm | HIMAL layer provided 10 μm | None | HIMAL layer provided 10 μm |
| Ultraviolet light absorption layer | Entire thermosetting resin sealing layer | First sealing layer | Primer layer | None | None |
| Ultraviolet light absorption layer thickness | 5000 | 200 | 10 | None | None |
| Ultraviolet light absorbent | 2-(2-Hydroxy-5-methylphenyl)benzotriazole | ← | ← | None | None |
| CAS Number | 2440-22-4 | ← | ← | None | None |
| Structural formula | 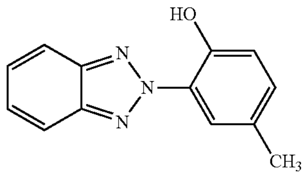 [SMILES: Cc1ccc(O)c(-n2nc3ccccc3n2)c1] | ← | ← | None | None |
| Content | 1 | ← | ← | None | None |
| P/C Resistance | 75 | 100 | 100 | 50 | 50 |

Next, power semiconductor modules of Examples 4 to 11 were prepared in the same manner as in Example 2, except that the thickness and the ultraviolet light absorbent content of the first sealing layer (ultraviolet light absorption layer) according to the second embodiment in Example 2 were varied. The primer layer was formed with the same composition and the same thickness as in Example 2. The results are shown in Table 2. The power semiconductor modules having a first sealing layer with a thickness of 100 μm to 1000 μm exhibited satisfactory results. Also, the modules with ultraviolet light absorbent content of 0.1 parts to 5 parts by mass exhibited twice higher reliability than the cases not provided with any ultraviolet light absorption layer. When the ultraviolet light absorbent content was increased to 7 parts by mass, the reliability tended to be slightly degraded compared to the cases of lower ultraviolet light absorbent content. The modules with a higher ultraviolet light absorbent content and a larger ultraviolet light absorption layer thickness exhibited slightly higher reliability than the known power semiconductor modules but slightly lower reliability than the case that exhibited the highest reliability.

TABLE 2

| | Example | | | | | | | | |
|---|---|---|---|---|---|---|---|---|---|
| | 2 | 4 | 5 | 6 | 7 | 8 | 9 | 10 | 11 |
| Structure | Second Embodiment | ← | ← | ← | ← | ← | ← | ← | ← |
| First sealing layer thickness | 200 | 100 | 500 | 1000 | 100 | 100 | 750 | 100 | 750 |
| Content | 1 | ← | ← | ← | 0.1 | 5 | 5 | 7 | 7 |
| P/C Resistance | 100 | 100 | 100 | 100 | 90 | 100 | 80 | 60 | 60 |

Next, power semiconductor modules of Examples 12 to 19 were prepared in the same manner as in Example 3, except that the thickness and the ultraviolet light absorbent content of the primer layer containing an ultraviolet light absorbent (ultraviolet light absorption layer) according to the third embodiment in Example 3 were varied. The results are shown in Table 3. The primer layer thicknesses presented in Table 3 are represented in μm. The results suggest that Table 3 shows that the primer layer with an ultraviolet light absorbent content of 0.1 parts by mass or more was effective regardless of whether the primer layer thickness is large or small, and notably, an ultraviolet light absorbent content of 1 part to 5 parts by mass led to high reliability.

TABLE 3

| | Example | | | | | | | | |
|---|---|---|---|---|---|---|---|---|---|
| | 3 | 12 | 13 | 14 | 15 | 16 | 17 | 18 | 19 |
| Structure | Third Embodiment | ← | ← | ← | ← | ← | ← | ← | ← |
| Primer layer thickness | 10 | 5 | 10 | 100 | 5 | 5 | 200 | 5 | 200 |
| Content | 1 | ← | ← | ← | 0.1 | 5 | 5 | 7 | 7 |
| P/C Resistance | 100 | 100 | 100 | 100 | 80 | 100 | 100 | 60 | 60 |

Next, power semiconductor modules of Examples 20 to 27 were prepared in the same manner as in Example 2, except that varying benzotriazole derivatives were used as the ultraviolet light absorbent to estimate the difference in the effect (of preventing deterioration by ultraviolet light to increase the reliability) among the ultraviolet light absorbents. The thickness of the first sealing layer (ultraviolet light absorption layer) and the thickness and composition of the primer layer were the same as those in Example 2. The results are shown in Tables 4 and 5. The results suggest that the ultraviolet light absorbents represented by formula (1) containing an alkyl group as $R_2$ or $R_4$ were notably good. The butyl group, which is bulky, is more preferable than the methyl group, which has a low molecular weight, as $R_2$ or $R_4$. More preferably, the number of butyl groups is greater. In other words, it is preferable for $R_2$ and $R_4$ to include bulky functional groups. Also, the results suggest that $R_3$ includes an octoxy group, which is an alkoxy group.

TABLE 4

| | Example | | |
|---|---|---|---|
| | 2 | 20 | 21 |
| Structure | Second Embodiment | ← | ← |
| Ultraviolet light absorbent | 2-(2-Hydroxy-5-methylphenyl)benzotriazole | 2-(5-tert-Butyl-2-hydroxyphenyl)benzotriazole | 2-(2-Hydroxy-3-tert-butyl-5-methylphenyl)-5-chlorobenzotriazole |
| CAS Number | 2440-22-4 | 3147-76-0 | 3896-11-5 |
| Structural formula | 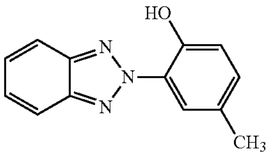 [SMILES: Cc1ccc(O)c(-n2nc3ccccc3n2)c1] | 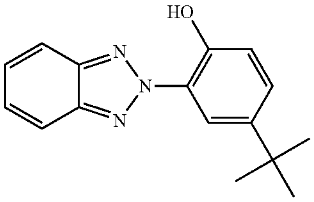 [SMILES: CC(C)(C)c1ccc(O)c(-n2nc3ccccc3n2)c1] | 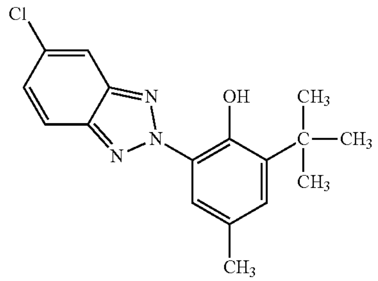 [SMILES: Cc1cc(-n2nc3ccc(Cl)cc3n2)c(O)c(C(C)(C)C)c1] |
| First sealing layer thickness | 200 | ← | ← |
| Content | 1 | ← | ← |
| P/C Resistance | 100 | 110 | 110 |

| | Example | |
|---|---|---|
| | 22 | 23 |
| Structure | ← | ← |
| Ultraviolet light absorbent | 2-(2-Hydroxy-3,5-di-tert-butylphenyl)benzotriazole | 2-(2-Hydroxy-3,5-di-tert-butylphenyl)-5-chloro-2H-benzotriazole |
| CAS Number | 3846-71-7 | 3864-99-1 |
| Structural formula | 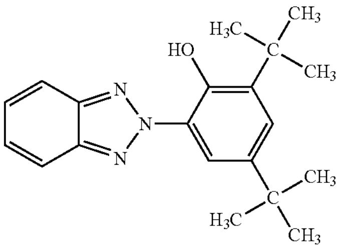 [SMILES: CC(C)(C)c1cc(-n2nc3ccccc3n2)c(O)c(C(C)(C)C)c1] | 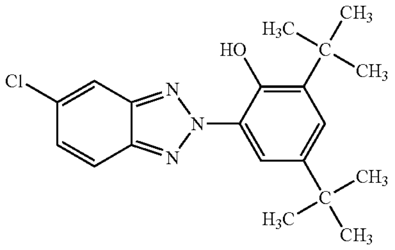 [SMILES: CC(C)(C)c1cc(-n2nc3ccc(Cl)cc3n2)c(O)c(C(C)(C)C)c1] |
| First sealing layer thickness | ← | ← |
| Content | ← | ← |
| P/C Resistance | 120 | 120 |

TABLE 5

| | Example | |
|---|---|---|
| | 24 | 25 |
| Structure | Second Embodiment | ← |
| Ultraviolet light absorbent | 2-(2-Hydroxy-4-octoxyphenyl)benzotriazole | 2-(2H-benzotriazole-2-yl)-6-(1-methyl-1-phenylethyl)-4-(1,1,3,3-tetramethylbutyl)phenol |
| CAS Number | 3147-77-1 | 73936-91-1 |

TABLE 5-continued

| | | |
|---|---|---|
| Structural formula | 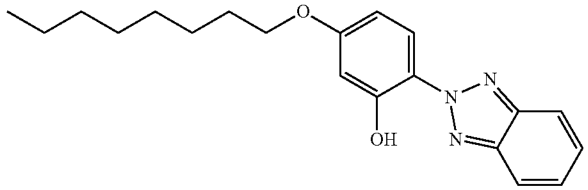 [SMILES: CCCCCCCCOc1ccc(-n2nc3ccccc3n2)c(O)c1] | 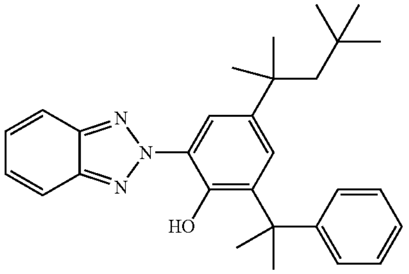 [SMILES: CC(C)(C)CC(C)(C)c1cc(-n2nc3ccccc3n2)c(O)c(C(C)(C)c2ccccc2)c1] |
| First sealing layer thickness | 200 | ← |
| Content | 1 | ← |
| P/C Resistance | 130 | 130 |

| | Example | |
|---|---|---|
| | 26 | 27 |
| Structure | ← | ← |
| Ultraviolet light absorbent | 1-Hydroxy-6-(trifluoromethyl) benzotriazole | 2-[2-hydroxy-3,5-bis(α,α-dimethylbenzyl)phenyl]-2H-benzotriazole |
| CAS Number | 26198-21-0 | 70321-86-7 |
| Structural formula | 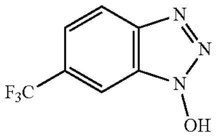 [SMILES: On1nnc2ccc(C(F)(F)F)cc21] | 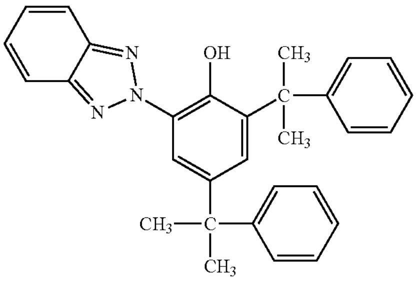 [SMILES: CC(C)(c1ccccc1)c1cc(-n2nc3ccccc3n2)c(O)c(C(C)(C)c2ccccc2)c1] |
| First sealing layer thickness | ← | ← |
| Content | ← | ← |
| P/C Resistance | 80 | 130 |

Next, power semiconductor modules of Examples 28 to 31 were prepared in the same manner as in Example 2, except that varying benzophenone derivatives were used as the ultraviolet light absorbent. The thickness of the first sealing layer (ultraviolet light absorption layer) and the thickness and composition of the primer layer were the same as those in Example 2. The results are shown in Table 6. The results suggest that the ultraviolet light absorbents represented by formula (2) containing an alkyl group or an alkoxy group as $R_{13}$ or $R_{14}$ increased the P/C resistance, and notably, containing an alkoxy group was advantageous. Also, the results suggest that the methoxy group and the allyloxy group are preferable as the alkoxy group.

TABLE 6

| | Example | |
|---|---|---|
| | 28 | 29 |
| Structure | Second Embodiment | ← |
| Ultraviolet light absorbent | 2-Hydroxy-4-methylbenzophenone | 2-Hydroxy-4-methoxybenzophenone |
| CAS Number | 3098-18-8 | 131-57-7 |
| Structural formula | 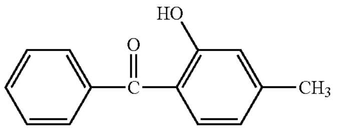 [SMILES: Cc1ccc(C(=O)c2ccccc2)c(O)c1] | 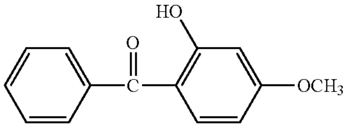 [SMILES: COc1ccc(C(=O)c2ccccc2)c(O)c1] |
| First sealing layer thickness | 200 | ← |

TABLE 6-continued

| | | |
|---|---|---|
| Content | 1 | ← |
| P/C Resistance | 100 | 110 |

| | Example | |
|---|---|---|
| | 30 | 31 |
| Structure | ← | ← |
| Ultraviolet light absorbent | 4-(Allyloxy)benzophenone | 2,2'-Dihydroxy-4-methoxybenzophenone |
| CAS Number | 42403-77-0 | 131-53-3 |
| Structural formula | 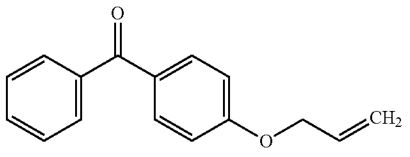 [SMILES: C=CCOc1ccc(C(=O)c2ccccc2)cc1] | 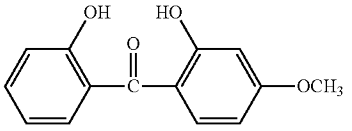 [SMILES: COc1ccc(C(=O)c2ccccc2O)c(O)c1] |
| First sealing layer thickness | ← | ← |
| Content | ← | ← |
| P/C Resistance | 120 | 110 |

Next, power semiconductor modules of Examples 32 to 38 were prepared in the same manner as in Example 2, except that varying triazine derivatives were used as the ultraviolet light absorbent. The thickness of the first sealing layer (ultraviolet light absorption layer) and the thickness and composition of the primer layer were the same as those in Example 2. The results are shown in Tables 7 and 8. The results reveal that triazine derivatives containing an alkyl group in any of $R_{21}$, $R_{25}$, and $R_{28}$ of formula (3) are preferable, triazine derivatives containing an alkoxy group in any of $R_{21}$, $R_{25}$, and $R_{28}$ are more preferable, and that the number of alkoxy groups is preferably greater.

TABLE 7

| | Example | |
|---|---|---|
| | 32 | 33 |
| Structure | Second Embodiment | ← |
| Ultraviolet light absorbent | 2-(2,4-Dihydroxypheny)-4,6-diphenyl-1,3,5-triazine | 2,4,6-tris(2,4-dihydroxyphenyl)-1,3,5-triazine |
| CAS Number | 38369-95-8 | 2125-23-7 |
| Absorption wavelength nm | 380 | 337 |
| Structural formula | 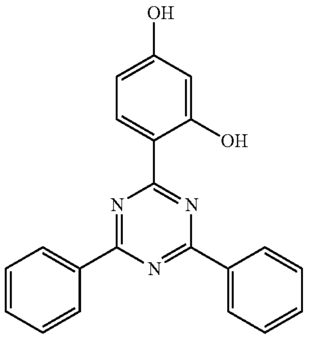 [SMILES: Oc1ccc(-c2nc(-c3ccccc3)nc(-c3ccccc3)n2)c(O)c1] | 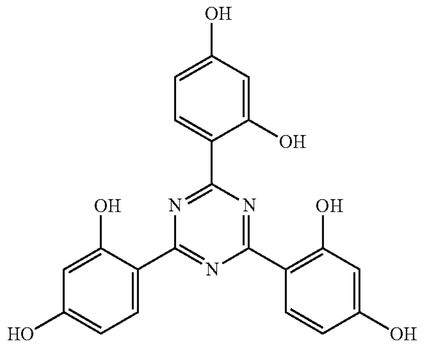 [SMILES: Oc1ccc(-c2nc(-c3ccc(O)cc3O)nc(-c3ccc(O)cc3O)n2)c(O)c1] |
| First sealing layer thickness | 200 | ← |
| Content | 1 | ← |
| P/C Resistance | 100 | 90 |

| | Example | |
|---|---|---|
| | 34 | 35 |
| Structure | | ← |
| Ultraviolet light absorbent | 2-(2,4-dihidroxjphenyl)-4,6-bis(2,4-dimethylphenyl)-1,3,5-triazine | 2-(2-hydroxy-4-methoxypheny)-4,6-diphenyl-1,3,5-triazine |
| CAS Number | 1668-53-7 | 106556-36-9 |
| Absorption wavelength nm | 380 | 340 |

TABLE 7-continued

| | | |
|---|---|---|
| Structural formula | 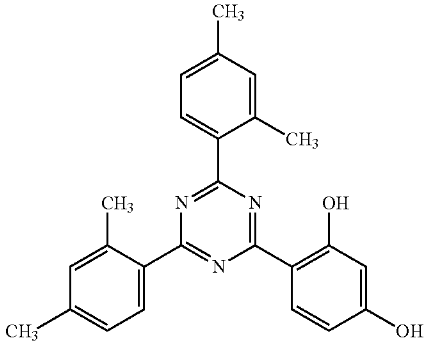 [SMILES: Cc1ccc(-c2nc(-c3ccc(C)cc3C)nc(-c3ccc(O)cc3O)n2)c(C)c1] | 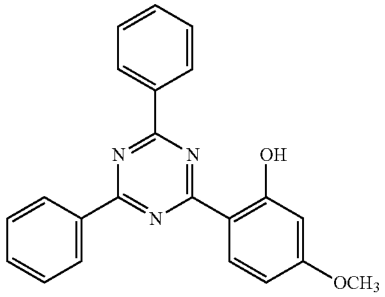 [SMILES: COc1ccc(-c2nc(-c3ccccc3)nc(-c3ccccc3)n2)c(O)c1] |
| First sealing layer thickness | ← | ← |
| Content | ← | ← |
| P/C Resistance | 110 | 110 |

TABLE 8

| | Example | |
|---|---|---|
| | 36 | 37 |
| Structure | Second Embodiment | ← |
| Ultraviolet light absorbent | 2,4-Bis(2,4-dimethylphenyl)-6-(2-hydroxy-4-n-octyloxyphenyl)-1,3,5-triazine | 2,4.6-Tris(4-butoxy-2-hydroxyphenyl)-1,3,5-triazine |
| CAS Number | 2725-22-6 | 3135494 |
| Absorption wavelength nm | 380 | 380 |
| Structural formula | 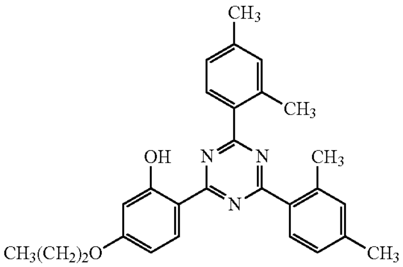 | 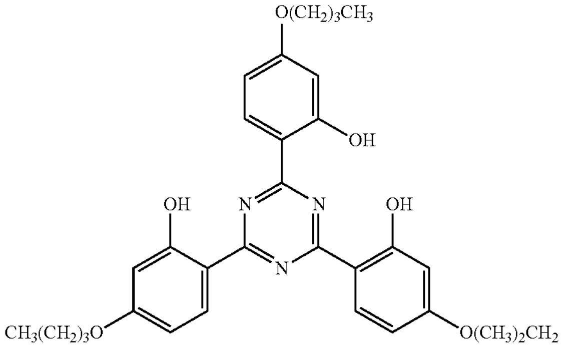 |
| First sealing layer thickness | 200 | ← |
| Content | 1 | ← |
| P/C Resistance | 120 | 130 |

| | Example 38 |
|---|---|
| Structure | ← |
| Ultraviolet light absorbent | 2,4-Bis(2-hydroxy-4-butoxyphenyl)-6-(2,4-bis-butoxyphenyl)-1,3,5-triazine |
| CAS Number | 208343-47-9 |
| Absorption wavelength nm | 380 |

TABLE 8-continued

| | |
|---|---|
| Structural formula | 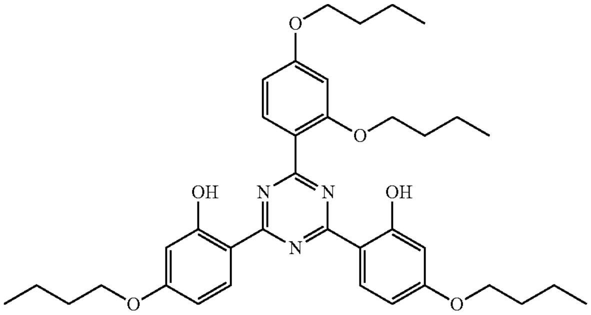 [SMILES: CCCCOc1ccc(-c2nc(-c3ccc(OCCCC)cc3O)nc(-c3ccc(OCCCC)cc3OCCCC)n2)c(O)c1] |
| First sealing layer thickness | ← |
| Content | ← |
| P/C Resistance | 130 |

According to the present invention, a highly reliable semiconductor device with increased power cycle resistance can be provided by providing an ultraviolet light absorption layer in the semiconductor device as in the disclosed embodiments.

REFERENCE SIGNS LIST

11 SiC semiconductor element
12 laminated substrate
121 electrically conductive plate
122 insulation substrate
123*a*, 123*b* electrically conductive plate
13 heat sink
14 aluminum wire
15 external terminal
16 case
17 bonding layer
18 lead frame
20 thermosetting resin sealing layer (ultraviolet light absorption layer)
21 first sealing layer (ultraviolet light absorption layer)
22 second sealing layer
23 primer layer (ultraviolet light absorption layer)
24 thermosetting resin sealing layer

What is claimed is:

1. A semiconductor device comprising:
a SiC semiconductor element mounted on a multilayer substate and an electrically conductive connection member; and
a sealant that seals the SiC semiconductor element and the electrically conductive connection member, containing: a matrix resin containing an epoxy resin base material, an inorganic filler and
an ultraviolet light absorbent,
wherein
the ultraviolet light absorbent is an organic material having an average particle size of 10 nm to 5000 nm, which absorbs 30% or more of ultraviolet light having a wavelength of 370 nm emitted from the SiC semiconductor element, and
the content of the ultraviolet light absorbent is 0.1 parts to 10 parts by mass relative to 100 parts by mass of the matrix resin, and
the content of the inorganic filler is 200 parts to 400 parts by mass, relative to 100 parts by mass of the matrix resin.

2. The semiconductor device according to claim 1, wherein the matrix resin further comprises a curing agent.

3. The semiconductor device according to claim 2, wherein and the ultraviolet light absorbent is uniformly dispersed in the sealant.

4. The semiconductor device according to claim 2,
wherein the thermosetting resin sealing layer comprises: a first sealing layer covering surroundings of the SiC semiconductor element; and a second sealing layer covering the first sealing layer, and
wherein the first sealing layer comprises the epoxy resin base material, the curing agent, the inorganic filler, and the ultraviolet light absorbent.

5. The semiconductor device according to claim 2, wherein the sealant comprises: a primer layer covering the SiC semiconductor element and the electrically conductive connection member; and the thermosetting resin sealing layer covering the primer layer, and wherein the primer layer comprises an ultraviolet light absorbent.

6. The semiconductor device according to claim 1, wherein the ultraviolet light absorbent is one, two or more selected from the group consisting of benzotriazole derivatives, benzophenone derivatives, and triazine derivatives.

7. The semiconductor device according to claim 5, wherein the primer layer comprises one or more resins selected from the group consisting of polyamide resins, polyimide resins, and polyamide-imide resins.

8. The semiconductor device according to claim 2, wherein the ultraviolet light absorbent is one, two or more selected from the group consisting of benzotriazole derivatives, benzophenone derivatives, and triazine derivatives.

9. The semiconductor device according to claim 4, wherein the ultraviolet light absorbent is on, two or more selected from the group consisting of benzotriazole derivatives, benzophenone derivatives, and triazine derivatives.

10. The semiconductor device according to claim 5, wherein the ultraviolet light absorbent is one, two or more selected from the group consisting of benzotriazole derivatives, benzophenone derivatives, and triazine derivatives.

11. The semiconductor device according to claim 3, wherein the ultraviolet light absorbent is at least one compound selected from (a) to (d):

(a) benzotriazole derivative with no phenyl substituents;

(b) benzotriazole derivative represented by formula (1):

(1)

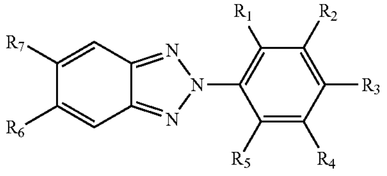

wherein, $R_1$ and $R_5$ each independently represent H or OH, $R_2$ and $R_4$ each independently represent H, OH, a linear or branched, saturated or unsaturated, monovalent hydrocarbon group with 1 to 6 carbon atoms, or a linear or branched, saturated, or unsaturated monovalent hydrocarbon group with 1 to 6 carbon atoms in which a hydrogen atom is substituted by a phenyl group, $R_3$ represents H, OH, or a linear or branched, saturated alkoxy group with 1 to 10 carbon atoms, $R_6$ and $R_7$ each independently represent H or Cl, and one or two or more H atoms constructing substituents $R_1$ to $R_7$ is optionally substituted by Cl;

(c) benzophenone derivatives are represented by the following formula (2):

(2)

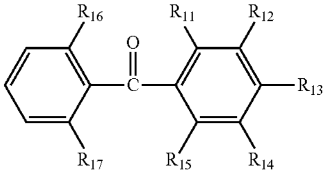

wherein, $R_{11}$, $R_{12}$, $R_{13}$, $R_{14}$, $R_{15}$, $R_{16}$, and $R_{17}$ are each independently selected from H, OH, and linear or branched, saturated or unsaturated, hydrocarbon groups with 1 to 3 carbon atoms, one or more of $R_{11}$ to $R_{17}$ is selected from OH, linear or branched alkyl groups with 1 to 3 carbon atoms, and linear or branched, saturated or unsaturated, alkoxy groups with 1 to 3 carbon atoms, and one or two or more H atoms forming these substituents is optionally substituted by Cl; and (d) triazine derivative represented by formula (3):

(3)

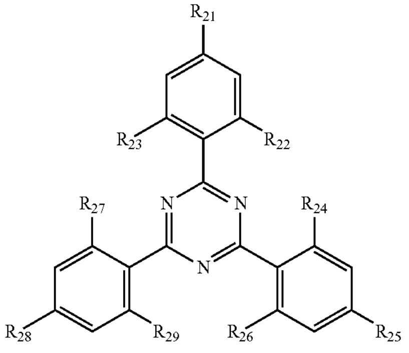

wherein, $R_{21}$, $R_{22}$, $R_{23}$, $R_{24}$, $R_{25}$, $R_{26}$, $R_{27}$, $R_{28}$, and $R_{29}$ are each independently selected from H, OH, linear or branched alkoxy groups with 1 to 8 carbon atoms, and linear or branched alkyl groups with 1 to 3 carbon atoms, provided that one or more substituents of $R_{21}$ to $R_{29}$ are selected from OH, linear or branched alkoxy groups with 1 to 8 carbon atoms and linear or branched alkyl groups with 1 to 3 carbon atoms, and one or two or more H atoms forming these substituents is optionally substituted by Cl.

12. The semiconductor device according to claim 11, wherein the at least one compound selected from (a) to (d) includes OH group.

13. The semiconductor device according to claim 11, wherein H at the 1- or 3-position of the benzotriazole derivative (a) is substituted by OH and H at the 5-or 6-position by a fluoromethyl group.

14. The semiconductor device according to claim 11, wherein (b) is selected from 2-(2-hydroxy-5-methylphenyl) benzotriazole, 2-(5-tert-butyl-2-hydroxyphenyl) benzotriazole, 2-(2-hydroxy-3-tert-butyl-5-methylphenyl)-5-chlorobenzotriazole, 2-(2-hydroxy-3,5-di-tert-butylphenyl) benzotriazole, 2-(2-hydroxy-3,5-di-tert-butylphenyl)-5-chloro-2H-benzotriazole, 2-(2-hydroxy-4-octoxyphenyl) benzotriazole, 2-(2H-benzotriazole-2-yl)-6-(1-methyl-1-phenylethyl)-4-(1,1,3,3-tetramethylbutyl) phenol, 1-hydroxy-6-(trifluoromethyl) benzotriazole, and 2-[2-hydroxy-3,5-bis (a, a-dimethylbenzyl) phenyl]-2H-benzotriazole.

15. The semiconductor device according to claim 11, wherein (c) is selected from 2-hydroxy-4-methylbenzophenone, 2-hydroxy-4-methoxybenzophenone, 4-(allyloxy) benzophenone, and 2,2'-dihydroxy-4-methoxybenzophenone.

16. The semiconductor device according to claim 11, wherein (d) is selected from 2-(2,4-dihydroxyphenyl)-4,6-diphenyl-1,3,5-triazine, 2,4,6-tris (2,4-dihydroxyphenyl)-1,3,5-triazine, 2-(2,4-dihydroxyphenyl)-4,6-bis (2,4-dimethylphenyl)-1,3,5-triazine, 2-(2-hydroxy-4-methoxyphenyl)-4,6-diphenyl-1,3,5-triazine, 2,4-bis(2,4-dimethylphenyl)-6-(2-hydroxy-4-n-octyloxyphenyl)-1,3,5-triazine, 2,4,6-tris (4-butoxy-2-hydroxyphenyl)-1,3,5-triazine, and 2,4-bis(2-hydroxy-4-butoxyphenyl)-6-(2,4-bis-butoxyphenyl)-1,3,5-triazine.

17. The semiconductor device according to claim 1, wherein the ultraviolet light absorbent is at least one compound selected from (a) to (d):

(a) benzotriazole derivative with no phenyl substituents;

(b) benzotriazole derivative represented by formula (1):

(1)

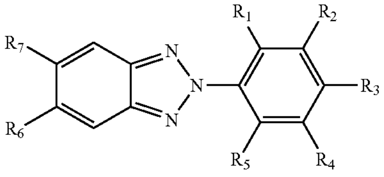

wherein, $R_1$ and $R_5$ each independently represent H or OH, $R_2$ and $R_4$ each independently represent H, OH, a linear or branched, saturated or unsaturated, monovalent hydrocarbon group with 1 to 6 carbon atoms, or a linear or branched, saturated, or unsaturated monovalent hydrocarbon group with 1 to 6 carbon atoms in which a hydrogen atom is substituted by a phenyl group, $R_3$ represents H, OH, or a linear or branched, saturated alkoxy group with 1 to 10 carbon atoms, $R_6$ and $R_7$ each independently represent H or Cl, and one or two or more H atoms constructing substituents $R_1$ to $R_7$ is optionally substituted by Cl;

(c) benzophenone derivatives are represented by the following formula (2):

(2)

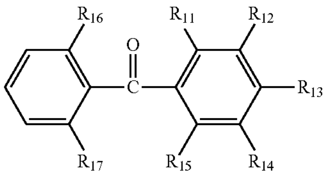

wherein, $R_{11}$, $R_{12}$, $R_{13}$, $R_{14}$, $R_{15}$, $R_{16}$, and $R_{17}$ are each independently selected from H, OH, and linear or branched, saturated or unsaturated, hydrocarbon groups with 1 to 3 carbon atoms, one or more of $R_{11}$ to $R_{17}$ is selected from OH, linear or branched alkyl groups with 1 to 3 carbon atoms, and linear or branched, saturated or unsaturated, alkoxy groups with 1 to 3 carbon atoms, and one or two or more H atoms forming these substituents is optionally substituted by Cl; and (d) triazine derivative represented by formula (3):

(3)

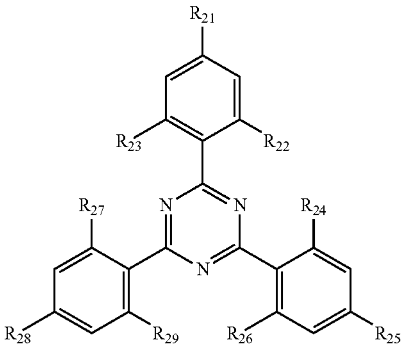

wherein, $R_{21}$, $R_{22}$, $R_{23}$, $R_{24}$, $R_{25}$, $R_{26}$, $R_{27}$, $R_{28}$, and $R_{29}$ are each independently selected from H, OH, linear or branched alkoxy groups with 1 to 8 carbon atoms, and linear or branched alkyl groups with 1 to 3 carbon atoms, provided that one or more substituents of $R_{21}$ to $R_{29}$ are selected from OH, linear or branched alkoxy groups with 1 to 8 carbon atoms and linear or branched alkyl groups with 1 to 3 carbon atoms, and one or two or more H atoms forming these substituents is optionally substituted by Cl.

* * * * *